(12) United States Patent
Beck et al.

(10) Patent No.: US 11,988,695 B2
(45) Date of Patent: May 21, 2024

(54) ARRANGEMENT FOR DETERMINING A CURRENT FLOWING THROUGH A BUSBAR

(71) Applicant: Siemens Energy Global GmbH & Co. KG, Munich (DE)

(72) Inventors: Michael Beck, Winkelhaid (DE); Alexander Wengler, Melkendorf (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 194 days.

(21) Appl. No.: 17/628,321

(22) PCT Filed: Jul. 19, 2019

(86) PCT No.: PCT/EP2019/069515
§ 371 (c)(1),
(2) Date: Jan. 19, 2022

(87) PCT Pub. No.: WO2021/013318
PCT Pub. Date: Jan. 28, 2021

(65) Prior Publication Data
US 2022/0317165 A1    Oct. 6, 2022

(51) Int. Cl.
*G01R 19/25* (2006.01)
*G01R 1/20* (2006.01)
*G01R 15/14* (2006.01)

(52) U.S. Cl.
CPC ......... *G01R 19/2506* (2013.01); *G01R 1/203* (2013.01); *G01R 15/144* (2013.01)

(58) Field of Classification Search
CPC ................. G01R 19/0092; G01R 19/2506
See application file for complete search history.

(56) References Cited

U.S. PATENT DOCUMENTS

| | | | | |
|---|---|---|---|---|
| 5,386,188 A | * | 1/1995 | Minneman | G01R 31/2818 324/715 |
| 5,446,372 A | * | 8/1995 | Berkcan | G01R 1/203 324/117 R |
| 5,804,979 A | * | 9/1998 | Lund | G01R 27/14 324/715 |
| 2001/0003419 A1 | * | 6/2001 | Ribes | G01R 1/203 324/126 |

(Continued)

FOREIGN PATENT DOCUMENTS

| CN | 10323138 A | 5/2014 |
|---|---|---|
| CN | 106053915 A | 10/2016 |

(Continued)

*Primary Examiner* — Steven L Yeninas
(74) *Attorney, Agent, or Firm* — Laurence A. Greenberg; Werner H. Stemer; Ralph E. Locher

(57) ABSTRACT

An arrangement for determining a magnitude of an electrical current flowing through a busbar. The arrangement has a measurement conductor which is electrically connected at a first contact point to the busbar and which extends from the first contact point to a second contact point. A third contact point is located on the busbar at a spacing distance from the first contact point. A voltage measurement device is configured to measure a voltage between the second contact point and the third contact point. The arrangement also has a controlled current source which is configured to introduce a measurement current into the measurement conductor.

18 Claims, 1 Drawing Sheet

(56) References Cited

U.S. PATENT DOCUMENTS

2015/0301148 A1   10/2015  Kaupp
2016/0291059 A1*  10/2016  Ausserlechner ....... G01R 1/203
2019/0170791 A1   6/2019   Hetzler et al.
2022/0178972 A1*  6/2022   Lo ..................... G01R 19/0092

FOREIGN PATENT DOCUMENTS

CN         109564246 A    4/2019
WO   WO 2006002446 A1   1/2006

\* cited by examiner

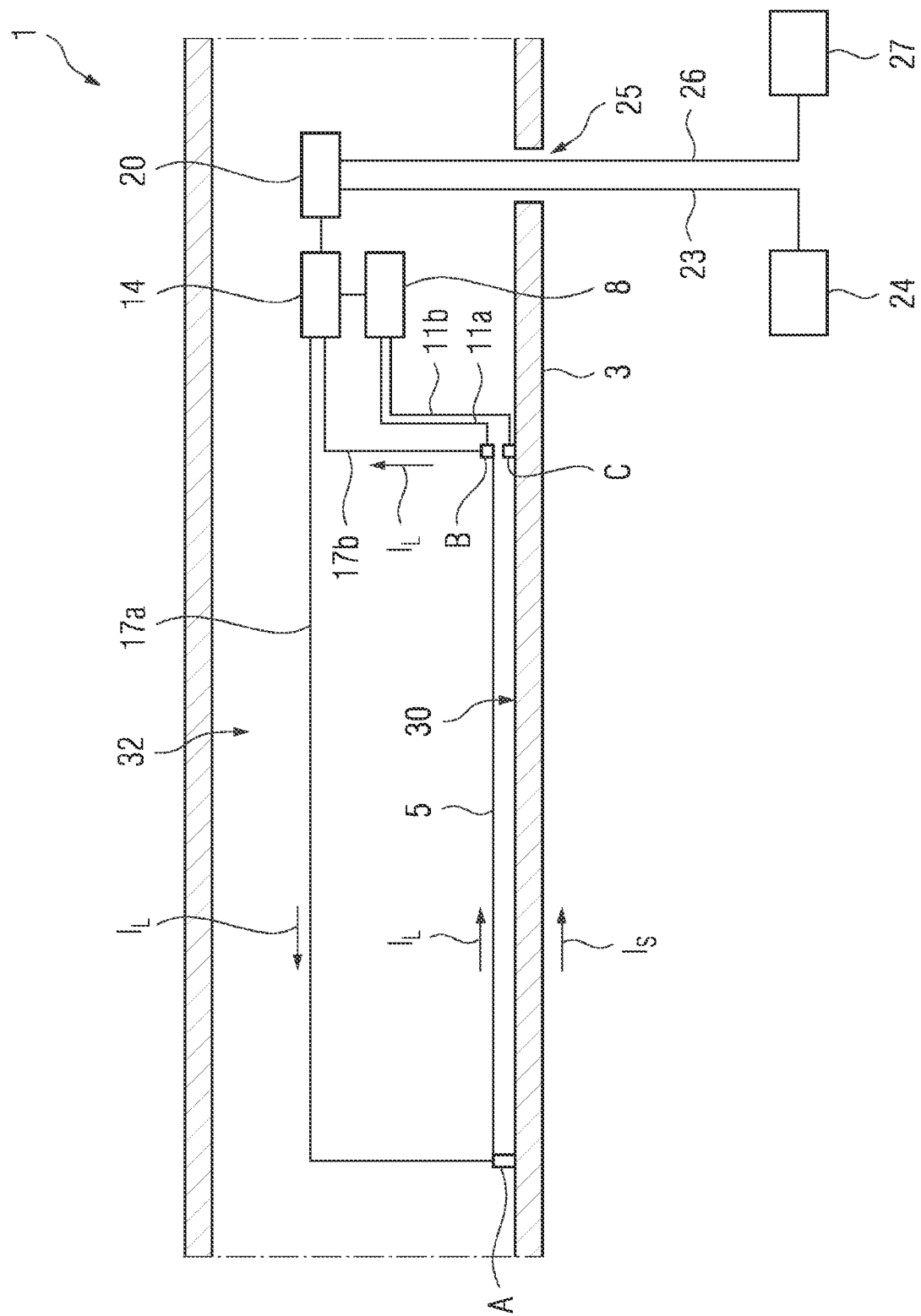

ARRANGEMENT FOR DETERMINING A CURRENT FLOWING THROUGH A BUSBAR

FIELD AND BACKGROUND OF THE INVENTION

The invention relates to an arrangement for determining the magnitude of an electrical current flowing through a busbar and to such a method.

Previously, it was conceivable to use a conventional current transformer of high precision, a current measurement shunt made of a special alloy or a so called zeroflux measuring point for determining the magnitude of an electrical current flowing through a busbar. Furthermore, a purely optical method could also be used for current measurement by means of a special optical waveguide. These solutions are relatively complex and expensive. In particular, this applies if the measurement is to be carried out in a wide frequency range of the current to be measured and/or if the measurement is to be carried out at high-voltage potential.

SUMMARY OF THE INVENTION

The underlying object of the invention is to specify an arrangement and a method with which the magnitude of a current flowing through a busbar can be determined with little effort.

This object is achieved according to the invention by an arrangement and by a method as claimed in the independent claims. Advantageous configurations of the arrangement and of the method are specified in the dependent claims.

An arrangement for determining the magnitude of a current flowing through a busbar is disclosed, with
- a measurement conductor which is electrically connected to the busbar at a first contact point and which extends from the first contact point to a second contact point,
- a third contact point which is arranged at the busbar spaced apart from the first contact point,
- a voltage measurement device which is set up for measuring a voltage which occurs between the second contact point and the third contact point, and
- a controlled current source which is set up for introducing a measurement current into the measurement conductor.

It is particularly advantageous in this arrangement that a part of the busbar (namely the part of the busbar between the first contact point and the third contact point) is also used for determining the magnitude of the current. The part of the busbar between the first contact point and the third contact point forms a current measurement shunt (current measurement resistor). Consequently, an additional component is advantageously not required as a current measurement shunt. The occurrence of additional power loss is also advantageously avoided as a result. The part of the busbar between the first contact point and the third contact point therefore has a dual function: it serves as a conductor and it simultaneously serves as a current measurement shunt. In addition to the busbar (present anyway), only the measurement conductor and some electronic devices (voltage measurement device, controlled current source) are necessary. As a result, the current can be reliably determined with little effort and in particular even at high frequencies.

The arrangement can be configured in such a way that the magnitude of the measurement current is controlled in such a way that the voltage which occurs between the second contact point and the third contact point assumes a preselected value, in particular the value zero, and
the arrangement has an evaluation device which determines the magnitude of the current flowing through the busbar from the magnitude of the measurement current, the cross sectional area of the measurement conductor which is effective for the current line and the cross sectional area of the busbar which is effective for the current line. If the voltage which occurs between the second contact point and the third contact point assumes the preselected value, in particular the value zero, then the magnitude of the current flowing through the busbar can be determined in a particularly simple manner from the magnitude of the measurement current, from the cross sectional area of the measurement conductor which is effective for the current line and from the cross sectional area of the busbar which is effective for the current line. The cross sectional area of the measurement conductor which is effective for the current line and the cross sectional area of the busbar which is effective for the current line are known and can in particular be regarded as constant.

The arrangement can be configured in such a way that the evaluation device determines the magnitude of the current flowing through the busbar according to the relationship $$I_S = k I_L A_S / A_L$$

wherein $I_S$ is the current flowing through the busbar, k is a proportionality constant, $I_L$ is the measurement current, $A_S$ is the cross sectional area of the busbar which is effective for the current line and $A_L$ is the cross sectional area of the measurement conductor which is effective for the current line.

The determination of the magnitude of the current in the evaluation device is relatively simple, since apart from the (known) current $I_L$ flowing through the measurement conductor, only the ratio of the cross sectional area of the busbar $A_S$ which is effective for the current line and the cross sectional area of the measurement conductor $A_L$ which is effective for the current line is required. Properties of the structural design of the arrangement can be taken into account by means of the proportionality constant k, for example the length of the current path in the busbar between the first contact point and the third contact point, the length of the current path in the measurement conductor between the first contact point and the second contact point, the material of the busbar and/or the material of the measurement conductor. The proportionality constant k can also assume the value 1 in the case of certain properties of the arrangement (for example if the lengths of the current paths are the same and the material of the busbar corresponds to the material of the measurement conductor).

The arrangement can be configured in such a way that the measurement conductor and the busbar consist of the same material. In this case, the specific resistance of the measurement conductor is advantageously equal to the specific resistance of the busbar. The magnitude of the current flowing through the busbar can thus be determined in a particularly simple manner by means of the evaluation device.

The arrangement can be configured in such a way that the measurement conductor is arranged on a surface of the busbar. In this case, it is advantageous for the measurement conductor to assume substantially the same temperature as the busbar. This means that no additional temperature measurement is required and a comparatively complex temperature compensation in the evaluation device can be dispensed with.

The arrangement can be configured in such a way that the measurement conductor is arranged on the surface of the busbar substantially in the flow direction of the current flowing through the busbar. In this case, it is particularly advantageous for the measurement conductor to assume the relevant temperature of the busbar (which in particular is influenced by the current flow induced heating of the busbar).

The arrangement can be configured in such a way that the busbar is a tubular busbar. Busbars of this type can be used with particular advantage in the high-voltage range.

The arrangement can also be configured in such a way that the measurement conductor is arranged on the inner surface of the tubular busbar. In this embodiment, the measurement conductor lies protected on the inner surface of the tubular busbar.

The arrangement can also be configured in such a way that the measurement conductor, the voltage measurement device, the controlled current source and/or the evaluation device are arranged in an interior of the tubular busbar. In this case, the measurement conductor, the voltage measurement device, the controlled current source and/or the evaluation device are arranged in a protected manner in the interior of the tubular busbar. In particular, they are therefore also arranged in a manner protected from the weather and are only exposed to a very low electromagnetic load. The interior of the tubular busbar is in fact practically free from electromagnetic fields (field freedom of the tube interior).

The arrangement can also be configured in such a way that the measurement conductor is bonded to the surface of the busbar. As a result, the measurement conductor can be applied in an insulated manner to the surface of the busbar in a simple manner. Moreover, bonding makes it possible to ensure that the measurement conductor assumes the temperature of the busbar quickly.

The arrangement can also have an energy transmission channel for supplying energy to the voltage measurement device, the controlled current source and/or the evaluation device.

The energy transmission channel can be configured as a first optical waveguide or a first electrical conductor, for example. The energy transmission channel therefore connects an energy supply device arranged outside the busbar with the voltage measurement device, the controlled current source and/or the evaluation device. In particular, electrical energy can be transmitted into the interior of the tubular busbar via this energy transmission channel.

The arrangement can also have a communication channel for transmitting the determined magnitude (i.e. the determined value) of the electrical current flowing through the busbar.

The communication channel can be configured as a second optical waveguide or a second electrical conductor, for example. The energy transmission channel and the communication channel can also be configured as a common optical waveguide or a common electrical conductor. Via the communication channel, data concerning the determined magnitude of the electrical current flowing though the busbar can therefore be transmitted away from the busbar (communication channel for data transmission). In particular, the communication channel enables the transmission of data out of the interior of the tubular busbar to a (busbar-external) data processing device.

The arrangement can also be configured in such a way that the length of the current path in the busbar between the first contact point and the third contact point substantially corresponds to the length of the current path in the measurement conductor between the first contact point and the second contact point. In this case, the current flowing through the busbar can be determined in a particularly simple manner, since both current paths are of equal length.

Furthermore, a method for determining the magnitude of a current flowing through a busbar is disclosed, with
   a measurement conductor which is electrically connected to the busbar at a first contact point and which extends from the first contact point to a second contact point,
   a third contact point which is arranged at the busbar spaced apart from the first contact point, wherein in the method
   the voltage which occurs between the second contact point and the third contact point is measured,
   a measurement current is introduced into the measurement conductor,
   the magnitude of the measurement current is controlled in such a way that the voltage which occurs between the second contact point and the third contact point assumes a preselected value, in particular the value zero, and
   the magnitude of the current flowing through the busbar is determined from the magnitude of the measurement current, the cross sectional area of the measurement conductor which is effective for the current line and the cross sectional area of the busbar which is effective for the current line.

The method can take place in such a way that the magnitude of the current flowing through the busbar is determined according to the relationship $$I_S = k I_L A_S / A_L$$

wherein $I_S$ is the current flowing through the busbar, k is a proportionality constant, $I_L$ is the measurement current, $A_S$ is the cross sectional area of the busbar which is effective for the current line and $A_L$ is the cross sectional area of the measurement conductor which is effective for the current line.

The method can take place in such a way that the measurement conductor and the busbar consist of the same material.

The method can also include one, a plurality of or all of the other features which are specified above in the context of the arrangement. The method and the arrangement have similar advantages, in particular the advantages which are specified above in the context of the arrangement.

BRIEF DESCRIPTION OF THE FIGURE

The invention is explained in greater detail hereinafter using an exemplary embodiment. For this purpose, the FIGURE represents an exemplary embodiment of an arrangement for determining the magnitude of a current flowing through a tubular busbar as well as the method taking place in this case.

DETAILED DESCRIPTION OF THE INVENTION

The FIGURE represents an exemplary embodiment of an arrangement 1 for determining the magnitude of a current $I_S$ flowing through a busbar 3 in a partial sectional view. In the exemplary embodiment, the busbar 3 is a tubular busbar, of which only two opposite wall areas are represented in cross section. The busbar 3 can in particular be a hollow cylindrical busbar. The busbar 3 has a first contact point A and a third contact point C. The current $I_S$ flows through the busbar from the first contact point A in the direction of the third contact point C. Owing to the ohmic resistance of the busbar, the flowing current $I_S$ creates an electrical potential difference (voltage) between the first contact point A and the third contact point C.

In the arrangement, the section of the busbar between the first contact point A and the third contact point C therefore serves as a measurement shunt for measuring the electrical current flowing through the busbar 3 (current measurement shunt). An additional measurement shunt is therefore advantageously not required.

A measurement conductor 5 is electrically connected to the busbar 3 at the first contact point A. Aside from the electrical connection at the first contact point A, the measurement conductor 5 is electrically insulated from the busbar 3. This is indicated schematically in the FIGURE by a spacing between the measurement conductor 5 and the busbar 3. The measurement conductor 5 is therefore electrically connected to the busbar 3 at the first contact point A and is otherwise arranged electrically insulated from the busbar 3. In other words, the measurement conductor 5 is arranged electrically insulated from the busbar 3 and is electrically connected to the busbar 3 (exclusively) at the first contact point A. The measurement conductor 5 can be a simple conductor 5 (for example a simple wire 5), the cross sectional area of which is substantially smaller than the cross sectional area of the busbar 3. The measurement conductor can also be referred to as a reference conductor.

The measurement conductor 5 extends from the first contact point A to a second contact point B. In the exemplary embodiment, the length of the measurement conductor between the first contact point A and the second contact point B is the same as the length of the current path of the busbar between the first contact point A and the third contact point C. In other words, the length of the current path in the busbar 3 between the first contact point A and the third contact point C substantially corresponds to the length of the current path in the measurement conductor 5 between the first contact point A and the second contact point B. However, these lengths may also be different in other exemplary embodiments.

Furthermore, the arrangement 1 has a voltage measurement device 8 which is electrically connected to the second contact point B by means of a first voltage measurement line 11a and to the third contact point C by means of a second voltage measurement line 11b. The voltage measurement device 8 is used for measuring a voltage which occurs between the second contact point B and the third contact point C. The voltage measurement device 8 is electrically connected to a controllable/controlled current source 14. This current source 14 is electrically connected to the first contact point A by means of a first feed line 17a. The current source 14 is also electrically connected to the second contact point B by means of a second feed line 17b. The controlled current source 14 introduces a current $I_L$ into the measurement conductor 5. This current $I_L$ flows from the current source 14 via the first feed line 17a, the first contact point A, the measurement conductor 5, the second contact point B and the second feed line 17b back to the current source 14. In this case, the measurement current $I_L$ flowing through the measurement conductor 5 can be much smaller than the current $I_S$ flowing through the busbar 3 which is to be determined. For example, the current $I_S$ flowing through the busbar 3 can be in the kiloamp range, while the measurement current $I_L$ can be in the milliamp range. This results in only small requirements for the controlled current source 14. For example, the measurement current $I_L$ can be smaller by a factor than the current $I_S$ flowing through the busbar 3, wherein the factor is between $10^4$ and $10^6$, in particular between $10^5$ and $10^6$. The measurement conductor 5 is oriented substantially in the flow direction of the current $I_S$ flowing through the busbar.

The current $I_L$ flowing through the measurement conductor 5 causes a potential difference between the first contact point A and the second contact point B. By means of the controlled current source 14, the current $I_L$ flowing through the measurement conductor 5 is controlled in such a way that the voltage which occurs between the second contact point B and the third contact point C assumes a preselected (predetermined) value. In the exemplary embodiment, the magnitude of the measurement current $I_L$ is controlled in such a way that this voltage assumes the value zero. However, in other exemplary embodiments, the magnitude of the measurement current $I_L$ can also be controlled in such a way that this voltage assumes a different preselected value.

As soon as the voltage between the second contact point B and the third contact point C has assumed the preselected value (here: the value zero), the magnitude of the associated measurement current $I_L$ is evaluated or further processed in an evaluation device 20. This evaluation device 20 determines the magnitude of the current $I_S$ flowing through the busbar from the magnitude of the measurement current $I_L$ and from the cross sectional area $A_L$ of the measurement conductor 5 which is effective for the current line and the cross sectional area $A_S$ of the busbar 3 which is effective for the current line. The effective cross sectional area $A_L$ of the measurement conductor 5 as well as the effective cross sectional area $A_S$ of the busbar 3 are known and are stored as constants in the evaluation device 20. In this case, the evaluation device determines the magnitude of the current $I_S$ flowing through the busbar according to the relationship $$I_S = k I_L A_S / A_L$$

In this case, $I_S$ is the current flowing through the busbar, k is a proportionality constant, $I_L$ is the measurement current, $A_S$ is the cross sectional area of the busbar which is effective for the current line and $A_L$ is the cross sectional area of the measurement conductor which is effective for the current line.

In the exemplary embodiment, the measurement conductor 5 and the busbar 3 consist of the same material, for example copper, aluminum or an alloy with one of these metals. In general, a different current-conducting material may also be used, in particular a metal. The measurement conductor 5 and the busbar 3 therefore have the same specific resistance value. In addition, the electrically effective spacing between the first contact point A and the second contact point B is the same length as the electrically effective spacing between the first contact point A and the third contact point C. In other words, the length of the current path in the busbar between the first contact point A and the third contact point C is substantially the same as the length of the current path in the measurement conductor 5 between the first contact point A and the second contact point B. In this case, the proportionality constant k has the value 1 (k=1). However, this proportionality constant k can also assume values other than 1 in other exemplary embodiments.

The evaluation device 20 is connected to an energy supply device 24 via an energy transmission channel 23. The energy transmission channel 23 can be configured as a first optical waveguide or as a first electrical conductor, for example. The electronic devices of the arrangement 1 are supplied with electrical energy via the energy transmission channel 23. This means that the voltage measurement device 8, the current source 14 and the evaluation device 20 are supplied with electrical energy via the energy transmission channel 23. In the exemplary embodiment, the energy supply device 24 is arranged outside the busbar 3. The energy transmission channel 23 runs from the interior of the tubular busbar to the energy supply device 24 via a recess 25 in the wall of the busbar. If the busbar 3 is operated at high-voltage potential, the configuration of the energy transmission channel 23 as an optical waveguide is advantageous, through which an electrical potential separation can then be realized.

Furthermore, the evaluation device 20 is connected to a data processing device 27 by means of a communication channel 26. The communication channel 26 can be configured as a second optical waveguide or as a second electrical conductor, for example. In this case, the data processing device 27 can have a data receiver and/or a data storage device, for example. This data processing device 27 can be a computer arranged at ground potential, for example. In particular, the evaluation device 20 transmits the determined magnitude of the electrical current $I_S$ flowing through the busbar 3 to the data processing device 27 via the communication channel 26. In addition, further data can optionally be transmitted from the evaluation device 20 to the data processing device 27 via the communication channel 26. Optionally, data can also be transmitted in the opposite direction from the data processing device 27 to the evaluation device 20 via the communication channel 26.

In the exemplary embodiment, the measurement conductor 5 is arranged on a surface 30 of the busbar 3. Specifically, the measurement conductor 5 is arranged on the inner surface 30 of the tubular busbar 3, i.e. in an interior 32 of the tubular busbar 3. The measurement conductor 5 can be bonded to this surface of the busbar by means of an electrically insulating adhesive, for example. As a result, the measurement conductor 5 (aside from the first contact point A) is electrically insulated from the busbar 3. In principle, the arrangement and the method can be used for measuring/determining the current flowing through the busbar 3 at any voltage. However, this arrangement and the method is particularly advantageous in the case of busbars which are at high-voltage potential. By means of the arrangement and the method, the current at high-voltage potential can in fact be determined with a high level of accuracy and high dynamics (i.e. in a wide frequency range). This is advantageous, for example, for the control and the protection of high-voltage power converters (for example for high-voltage direct current transmission) or for the determination of an electrical power transmitted via the busbar 3 (for example for the purpose of settling the power transmission).

The arrangement and the method were described above using the example of a tubular busbar. However, the arrangement and the method can also be realized with a different busbar, for example with a flat strip busbar.

The arrangement described and the method described have a number of advantages:

the arrangement 1 and the method described have a large measuring dynamic range because a part of the busbar 3 is used as a current measurement shunt and additionally only one simple measurement conductor 5 is necessary. In contrast, when using additional resistance-based components as current measurement shunts, significant limitations in the measuring dynamics would have to be anticipated owing to their complicated design and choice of material. Furthermore, temperature measurement and temperature compensation is advantageously not required because the measurement conductor substantially assumes a defined temperature, namely the temperature of the busbar 3. There is also no significant additional power loss because only a comparatively small current flows through the measurement conductor 5. Furthermore, a complex mechanical design for fixing the arrangement (in particular at high-voltage potential) is not required, since the arrangement is preferably arranged inside/in the interior of the tubular busbar 3. If the measurement conductor 5 consists of the same material as the busbar 3, expensive special alloys can also be dispensed with for the measurement conductor. The specific resistance of the measurement conductor is then equal to the specific resistance of the busbar, such that the current flowing through the busbar 3 can be determined in a very simple manner from the measurement current $I_L$ and the ratio of the cross sectional areas of the busbar and of the measurement conductor.

The arrangement 1 and the method can be realized in a simple and cost effective manner, since apart from the busbar present anyway and the voltage measurement device 8, current source 14 and evaluation device 20, only one cost effective measurement conductor 5 is required. The measurement conductor and the electronic devices (voltage measurement device 8, current source 14, evaluation device 20) lie protected inside the tubular busbar, in particular protected from the weather and in an almost field-free space. The weight of the arrangement is substantially lower than the weight of an additional shunt resistor for large currents would be. In addition, a complex insulation is not required, since the essential components of the arrangement are arranged at the potential of the busbar. The measuring accuracy of the arrangement is barely affected by thermal influences, since the arrangement is at a defined temperature, in particular assumes the temperature of the busbar. As a result of appropriately selecting the cross sectional area of the measurement conductor, the cross sectional area of the busbar, the length of the current path between the first contact point A and the third contact point C and/or the length of the current path between the first contact point A and the second contact point B, well suited values can be selected for the measurement current $I_L$ as well as for the voltage which is to be measured between the second contact point B and the third contact point C, for example values which are well suited for the evaluation in the evaluation device 20. In particular, the cross section of the measurement conductor 5 can be selected in such a way that the measurement current $I_L$ is within a desired range which can be covered in a cost effective manner by means of the current source 14. Additionally equipping the busbar in a complex manner with corona rings or the like is not necessary.

In particular, a conductor with a small cross sectional area (and thus a very low volume) is sufficient for the measurement conductor 5. This measurement conductor can therefore be attached to the surface of the tubular busbar from the inside in a simple manner (for example bonded to the inner surface of the tubular busbar). The measurement conductor 5 advantageously has the same temperature as the busbar 3. The thermal influence is thus compensated without complex compensation circuits being necessary for this purpose. If the measurement conductor 5 and the busbar 3 consist of the same material, then both elements also have the same specific resistance. When determining the current flowing through the busbar, it is only necessary to drive a (small) current (measurement current $I_L$) via the measurement conductor 5 and to control the voltage difference between the second contact point and the third contact point to a predetermined value, in particular to zero. This can be done in a simple and precise manner with cost effective technology. In general, the method described and the arrangement described can be realized in a cost effective manner, and a reliable and robust solution for determining the magnitude of a current flowing through the busbar (even at high-voltage potential and/or at high frequencies) is nevertheless made possible.

The invention claimed is:

1. An arrangement for determining the magnitude of a current flowing through a busbar, the arrangement comprising:
    a measurement conductor which is electrically connected to the busbar at a first contact point and which extends from the first contact point to a second contact point;
    a third contact point arranged at the busbar and spaced apart from the first contact point;
    a voltage measurement device configured for measuring a voltage between the second contact point and the third contact point;
    a controlled current source configured for injecting a measurement current into said measurement conductor; and
    an evaluation device configured to determine the magnitude of the current flowing through the busbar from a magnitude of a measurement current, from a cross sectional area of said measurement conductor that is effective for conducting the current, and from a cross sectional area of the busbar that is effective for conducting the current.

2. The arrangement according to claim 1, wherein: the magnitude of the measurement current is controlled to have the voltage between the second contact point and the third contact point assume a preselected value.

3. The arrangement according to claim 2, wherein the magnitude of the measurement current is controlled to drive the voltage between the second and third contact points to zero.

4. The arrangement according to claim 2, wherein said evaluation device is configured to determine the magnitude of the current flowing through the busbar according to the relationship $$I_S = k\, I_L A_S/A_L$$

wherein $I_S$ is the current flowing through the busbar, k is a proportionality constant, $I_L$ is the measurement current, $A_S$ is the cross sectional area of the busbar effective for conducting the current, and $A_L$ is the cross sectional area of the measurement conductor effective for conducting the current.

5. The arrangement according to claim 1, wherein said measurement conductor is formed of the same material as the busbar.

6. The arrangement according to claim 1, wherein said measurement conductor is arranged on a surface of the busbar.

7. The arrangement according to claim 6, wherein said measurement conductor is arranged on the surface of the busbar substantially in a direction of flow of the current flowing through the busbar.

8. The arrangement according to claim 1, wherein the busbar is a tubular busbar.

9. The arrangement according to claim 8, wherein said measurement conductor is arranged on an inner surface of the tubular busbar.

10. The arrangement according to claim 8, wherein at least one of said measurement conductor, said voltage measurement device, said controlled current source, or said evaluation device are arranged in an interior of the tubular busbar.

11. The arrangement according to claim 1, wherein said measurement conductor is bonded to a surface of the busbar.

12. The arrangement according to claim 1, further comprising an energy transmission line for supplying energy to at least one of said voltage measurement device, said controlled current source, or said evaluation device.

13. The arrangement according to claim 1, further comprising a communication channel for transmitting the determined magnitude of the electrical current flowing through the busbar.

14. An arrangement for determining the magnitude of a current flowing through a busbar, the arrangement comprising:
    a measurement conductor which is electrically connected to the busbar at a first contact point and which extends from the first contact point to a second contact point;
    a third contact point arranged at the busbar and spaced apart from the first contact point;
    a voltage measurement device configured for measuring a voltage between the second contact point and the third contact point;
    a controlled current source configured for injecting a measurement current into said measurement conductor;
    wherein a length of a current path in the busbar between said first contact point and said third contact point is substantially equal to a length of a current path in said measurement conductor between said first contact point and said second contact point.

15. A method of determining a magnitude of a current flowing through a busbar, the method comprising:
    providing a measurement conductor that is electrically connected to the busbar at a first contact point and extends from the first contact point to a second contact point, and a third contact point arranged at the busbar at a spacing distance from the first contact point;
    measuring a voltage between the second contact point and the third contact point;
    injecting a measurement current into the measurement conductor;
    controlling a magnitude of the measurement current to drive the voltage between the second contact point and the third contact point to a preselected value; and
    determining the magnitude of the current flowing through the busbar from the magnitude of the measurement current, from a cross sectional area of the measurement conductor that is effective for conducting the current, and from a cross sectional area of the busbar that is effective for conducting the current.

16. The method according to claim 15, which comprises controlling the magnitude of the measurement current to cause the voltage between the second contact point and the third contact point to a assume a zero value.

17. The method according to claim 15, wherein the step of determining the magnitude of the current flowing through the busbar comprises resolving the relationship $$I_S = k\, I_L A_S/A_L$$

wherein $I_S$ is the current flowing through the busbar, k is a proportionality constant, $I_L$ is the measurement current, $A_S$ is the cross sectional area of the busbar that is effective for conducting the current, and $A_L$ is the cross sectional area of the measurement conductor that is effective for conducting the current.

18. The method according to claim 15, wherein the measurement conductor and the busbar consist of the same material.

* * * * *